(12) United States Patent
Foth

(10) Patent No.: US 6,969,863 B2
(45) Date of Patent: Nov. 29, 2005

(54) ARRANGEMENT FOR FEEDING OR DISSIPATING HEAT TO/FROM A SEMICONDUCTOR SUBSTRATE FOR THE PURPOSE OF PREPARING OR POST-PROCESSING A LITHOGRAPHIC PROJECTION STEP

(75) Inventor: Matthias Foth, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/883,623

(22) Filed: Jul. 1, 2004

(65) Prior Publication Data

US 2005/0035312 A1 Feb. 17, 2005

(30) Foreign Application Priority Data

Jul. 1, 2003 (DE) ................................ 103 29 644

(51) Int. Cl.⁷ ......................... H01L 21/00; G01N 21/86
(52) U.S. Cl. .............................. 250/559.29; 250/559.3; 250/341.8; 414/935; 356/614
(58) Field of Search ................... 250/559.29, 559.3, 250/559.33, 559.37, 559.38, 559.4, 221, 250/548, 341.1, 341.8; 356/614, 624; 414/935, 414/941

(56) References Cited

U.S. PATENT DOCUMENTS 5,563,798 A * 10/1996 Berken et al. .............. 700/218

6,274,878 B1   8/2001 Li et al.
6,624,898 B1   9/2003 Chen
2002/0109111 A1   8/2002 Hall et al.

FOREIGN PATENT DOCUMENTS

DE   100 33 817 A1   11/2001

* cited by examiner

Primary Examiner—Kevin Pyo
(74) Attorney, Agent, or Firm—Slater & Matsil, L.L.P.

(57) ABSTRACT

The arrangement comprises a hot or cool plate (12) that has a substantially planar surface for accommodating the semiconductor substrate and for transmitting heat between the hot or cool plate and the semiconductor substrate, a source (10) of heat or cold that is connected to the hot or cool plate (12) for the purpose of heating or cooling, a device (25) for depositing or lifting the semiconductor substrate (8) onto/from the surface of the hot or cool plate (12). A light source (200) can be used to generate a focused light beam (80), preferably a laser beam, which is detected by a detector (100) with at least one sensor (110–140) after reflection by a wafer (8) deposited on the hot or cool plate (12). A control unit that is connected to the detector (100) for the purpose of evaluating a position of the reflected light beam determines a possible deposition error by comparing the position with one of a wafer (8) deposited with its entire surface on the hot or cool plate (12). A device (25) for depositing or lifting the semiconductor substrate is controlled in this case, the wafer being lifted and redeposited again.

14 Claims, 2 Drawing Sheets

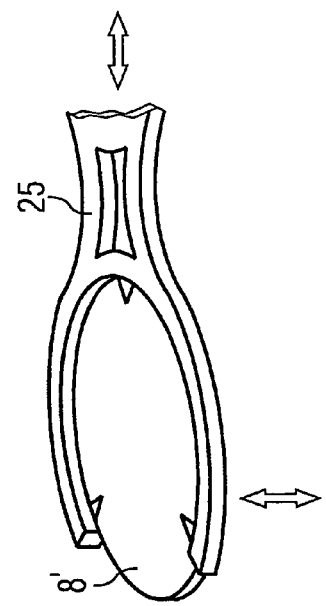
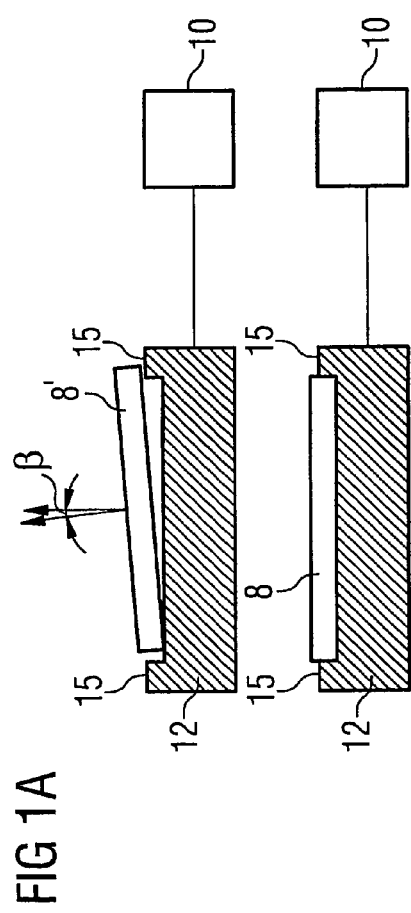
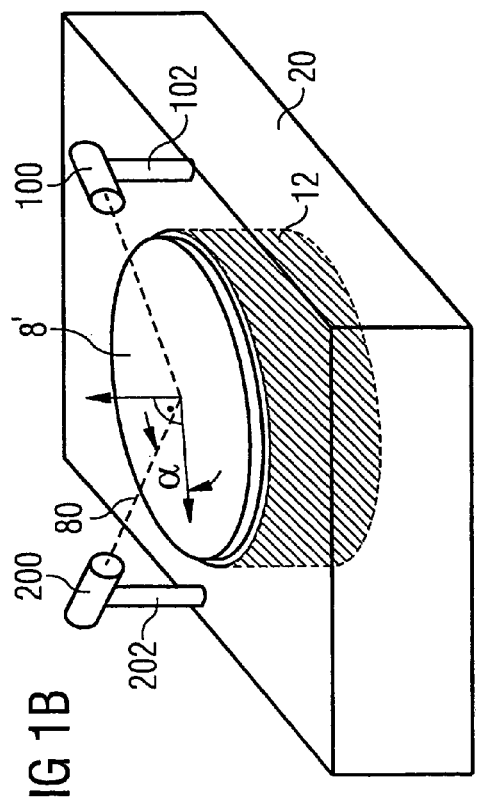
FIG 1A
FIG 1B

ARRANGEMENT FOR FEEDING OR DISSIPATING HEAT TO/FROM A SEMICONDUCTOR SUBSTRATE FOR THE PURPOSE OF PREPARING OR POST-PROCESSING A LITHOGRAPHIC PROJECTION STEP

This application claims priority to German Patent Application 103 29 644.1, which was filed Jul. 1, 2003 and is incorporated herein by reference.

TECHNICAL FIELD

The present invention relates to an arrangement for feeding or dissipating heat to/from a semiconductor substrate for the purpose of preparing or post-processing a lithographic projection step.

BACKGROUND

Lithographic clusters in each case comprise exposure tools such as wafer steppers or wafer scanners, and automated lines, frequently controlled by robots, for loading or unloading the exposure tools or further tools. Process stations closely associated with the relevant exposure steps are arranged along these lines. These include the resist coating, adhesion units, developer processes, cleaning steps and, in particular, hot and cool stations that bring the semiconductor substrates to be exposed or to be developed up to a temperature required for the respective process, or produce a temperature by means of which a process is effected on the semiconductor substrate. These process stations are termed hot or cool plates.

The automated process lines are required, in particular, because manual handling of the individual substrates would, for example, interrupt critical temperature steps, cause contamination or give rise to errors in time steps requiring to be observed without fail in the photolithographic process.

The hot and cool plates are used, in particular, upstream and downstream of the resist coating and developing stations.

The thermal processes that are carried out on the hot or cool plates take place, as a rule, on the basis of the transfer of heat from or to the heated hot/cool plate to the semiconductor substrate deposited on the hot or cool plate. The planar rear side of a semiconductor substrate makes contact in this case with the likewise substantially planar surface of the hot/cool plate (also simply called "plate" below). The thermal process actually is performed on the semiconductor substrate as a function of the thermal conductivity of the surface of the plate in combination with the period of action and the thermal energy fed or dissipated to or from the plate.

If a semiconductor substrate is not lying with its entire area on the hot or cool plate, the maximum contact area defined by the area of the substrate rear side is reduced. There is a diminished transfer or dissipation of heat that can, in particular in the case of critical lithography planes, have a disadvantageous effect on the structures developed in the photosensitive resist. Such a case can occur when a semiconductor substrate is deposited inaccurately on the plate because of the automatic handling on the automatic line.

A frequently occurring case consists in that semiconductor substrates are deposited, for example, on position markings in the edge region of the relevant plate, the true purpose of which markings is to permit the substrate to be correctly positioned on the plate. These position markings project somewhat on the plate, and so the semiconductor substrates rest on the position mark on one side with the edge, while they are capable of touching the heated or cooled contact surface with the other edge. The semiconductor substrate is therefore heated or cooled inhomogeneously, and so the structures formed in the resist are non-uniformly fixed.

This leads to so-called uniformity problems, that is to say differences in the structural widths of lines that were originally transferred from a mask with the same width during exposure. When this problem is recognized, the relevant wafers must be post-processed after measurement in a CD microscope measuring instrument (CD critical dimension) employing methods that consume time and material, this being so-called rework. It is to be remarked in this case that although optical, visual controls are carried out after the lithography processing of the small structural widths, it is impossible in practice to detect quality defects only with the help of simple lenses.

However, the expensive microscope measuring instrument for determining the critical dimension is used only in individual cases for the purpose of finding semiconductor substrates situated outside the process specification. Only a small number of wafers from, for example, 25 semiconductor substrates (wafers) of a batch are actually measured in accordance with statistical stipulations. It can happen in this case that the randomly measured semiconductor substrates are not even found in some circumstances. The result can therefore be that a batch affected by quality defects will leave the lithographic process area without detection of the defect, and be subjected to a subsequent process step. In this case, no more post-processing would be possible, resulting in a high loss in yield.

One proposed solution consists in using a sensor, for example, to measure the temperature of the hot or cool plate at regular, short time intervals, and thus to track the temporal temperature profile while a semiconductor substrate is being laid on a plate. Because of the different temperature, when a substrate is laid down there is firstly a temperature jump in the plate. Given ideal contact, that is to say correct positioning by the automatic handling system, a large temperature jump is to be expected because of the optimum heat transfer. As a rule, a cool or hot plate is connected to a source of heat or cold in such a way that a control loop achieves restitution of the desired temperature as quickly as possible. Consequently, a second counter-excursion takes place, for example after the first temperature jump owing to the laying down of the semiconductor substrate. This excursion overcompensates the first temperature jump, and so the substrate quickly reaches its desired temperature.

The result is a characteristic temperature profile. This is measured for the case of an ideal contact over the entire surface and stored as reference. Thereafter, each current heating or cooling process can be measured likewise and compared with the stored reference. If the two temperature profiles differ from one another beyond a predefined limiting value, an error code is generated that can be used as index for the tilted position of a semiconductor substrate on the hot or cool plate. It is thereby still possible to intervene in the lithographic cluster from outside during processing, and to post-process the substrate with an outlay that is now still low.

A disadvantage of this approach to the solution consists in that reliable detection of the tilted position of semiconductor substrates necessarily requires a learning cycle because of the non-trivial temperature profile. To date, it has been possible to apply appropriate software only on the hot plate side of a combined cool/hot plate arrangement (CHP, Cool/Hot Plate).

A tilted position on the associated cool plate side has continued to be undetected, by contrast. In addition, the method in accordance with the prior art is a function of the desired temperature of the cool or hot plate and also, for example, of the diameter of the semiconductor substrate respectively used. The flexibility of such a method is therefore limited, and must be readjusted for the respective application.

SUMMARY OF THE INVENTION

In one aspect, the invention relates to hot and cool plates for accommodating semiconductor substrates as they are used in automated lines of lithographic clusters. The preferred embodiment of the present invention offers a cost-effective arrangement that permits the detection of tilted positions of semiconductor substrates on cool or hot plates in the existing equipment of a lithographic cluster with high precision and flexibility and only a low outlay. Embodiments of the invention also improve the quality and yield of semiconductor fabrication.

The preferred embodiment provides an arrangement for feeding or dissipating heat to/from a semiconductor substrate for the purpose of preparing or post-processing a lithographic projection step, comprising: at least one hot or cool plate that has a substantially planar surface for accommodating the semiconductor substrate and for transmitting heat between the hot or cool plate and the semiconductor substrate, a source of heat or cold for the purpose of heating or cooling the hot or cool plate, that is connected to the hot or cool plate, a device for depositing or lifting the semiconductor substrate onto/from the surface of the hot or cool plate, a light source for generating a focused light beam, preferably a laser, a detector with at least one sensor for detecting the light beam generated by the light source and reflected by the semiconductor substrate, and a control unit that is connected to the detector for the purpose of evaluating a position of the reflected light beam, and at least to the device for depositing or lifting the semiconductor substrate.

It is possible with the aid of such an arrangement to avoid, for example, tiltings such as arise when semiconductor substrates such as wafers or flat panels are deposited inaccurately onto hot or cool plates. It is also provided to apply the arrangement to the fabrication of masks or reticules. The intention here is that the term semiconductor substrates also includes masks or reticules during the lithographic patterning of which it is likewise possible to use automated process lines with cool and hot plates upstream and downstream of an exposure.

The arrangement comprises a light source and a detector. These can be respectively located, for example, at different positions in a housing of the hot or cool plate. The light source generates a sharply focused light beam. A laser can advantageously be involved in this case. A light source emitting light over a large angle and whose light is focused via a lens system, for example, is also covered by the invention, however.

The light source is positioned in such a way that in at least one alignment it can direct a light beam onto a semiconductor substrate deposited on the hot or cool plate. For this purpose, the light source can be fixed in exactly one position, or it can, for example, have a movement or pivot mechanism with the aid of which it can be moved into the above-named measuring position in the case of a measurement to be carried out. It would thereby also be possible to enable measuring positions that in the case of fixing would complicate the position or lifting of the substrate from the plate.

In accordance with an advantageous refinement of the invention, the light source emits light of a wavelength of more than 600 nm. This ensures that the substrates possibly already coated with a photosensitive layer are inadvertently exposed.

The detector is preferably mounted in a position, for example on the housing, that permits the light beam emitted by the light source and reflected by the surface of a deposited semiconductor substrate to be picked up with the aid of a sensor. The position of the detector, as of the light source, is permanently prescribed in this measuring position. A flat, plan-parallel semiconductor substrate that is deposited correctly on the hot or cool plate is therefore detected at a fixed point at a predetermined angle of incidence of the beam from the light source.

The detector with the sensor is located for this purpose in a beam path that is defined by the condition of an angle of emergence equal to the angle of incidence. The sensor has an area with a diameter that is preferably greater than the beam diameter of the light beam emitted by the light source.

If the semiconductor substrate is in a tilted position, which can result in particular due to inaccurate depositing by the transport system of the automatic line, there is a change, for example, in the angle of incidence of the light beam on the substrate. Consequently, the angle of emergence of the reflected light beam also changes, and so there is a change in the positioning of the entire beam path. The point of intersection of the beam with a plane defined by the sensor surface therefore likewise drifts and departs from a point of intersection of the light beam with the plane that results for the above-mentioned ideal case of a correctly deposited substrate.

The detector can have, for example, only one sensor that, for example, measures the intensity of a beam of a light entering at its surface. A tilted position of a substrate therefore leads here to a quick drop in the measured intensity, or to vanishing.

However, the detector can also, for example, have a quad cell (four-fold photodiode) with the aid of which the alignment of a tilted position of the semiconductor substrate can already be determined. Finally, however, it is also possible here to use a CCD chip so that the angle of deflection and the magnitude of the deviation from the ideal position owing to the displacement of the point of infringement of the reflected light beam on the chip surface can be determined.

BRIEF DESCRIPTION OF THE DRAWINGS

The invention is now to be explained in more detail with reference to an exemplary embodiment, and with the aid of a drawing, in which:

FIG. 1, which includes FIGS. 1a and 1b, shows a schematic cross section of a wafer laid down in a tilted fashion on a hot or cool plate (a), and the perspective view of an embodiment according to the invention with a light source and detector (b);

FIG. 2, which includes

DETAILED DESCRIPTION OF ILLUSTRATIVE EMBODIMENTS

Figure 2A:
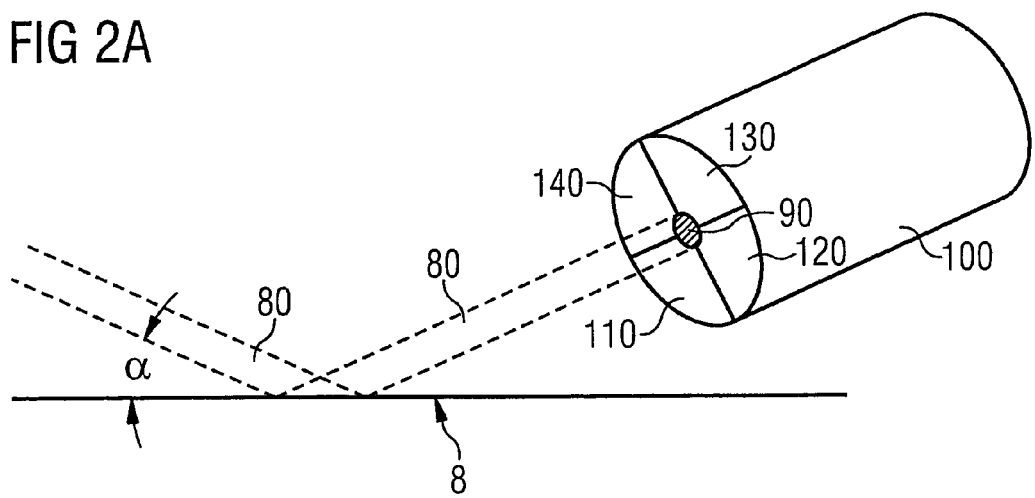
FIGS. 2a and 2b, shows an illustration of the light beam reflected in accordance with the arrangement according to the invention by a wafer surface that is mounted ideally (a) and in a tilted fashion (b) and strikes a quad cell.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIG. 1a shows a schematic and very simplified illustration of the problem on which the invention is based. A wafer 8 making ideal contact with a hot or cool plate 12 is illustrated in the lower part of the figure. Projecting position markings 15 ensure that the wafer 8 is optimally aligned. The plate is connected to a source 10 of heat or cold, which feeds the plate heat or dissipates heat from it.

The plate can be, for example, a so-called CHP unit (cool plate) of an automated lithography line ("track") from Tokyo Electron Limited (TEL), such as their ACT 8 or ACT 12 products/designs, for example. However, in addition to a CHP unit, the illustration reproduced in a generalized fashion in FIG. 1a can just as well represent LHP (low hot plate), HHP (high hot plate), PHP (precision hot plate), CPL (cool plate) or ADH (adhesion) units in a lithographic track. In other embodiments, the plate has no thermal properties at all.

A device (not shown in FIG. 1) for depositing or lifting the semiconductor substrate on/from the surface of the plate initially lays the wafer of the semiconductor substrate on the plate for the purpose of carrying out the temperature regulation step. Before the heat is fed or dissipated, it is further detected whether the wafer has been deposited, as shown at the bottom of FIG. 1a, with its entire surface making contact with the plate, or else in a tilted fashion, as is shown in FIG. 1a at the top with the aid of the wafer 8', which does not rest over its entire area. Such a check can be made for each wafer of a batch as appropriate, even during the time when the temperature regulation process has already begun.

As is shown in FIG. 1b, for this purpose a laser 200 that emits an infrared light beam 80 of wavelength greater than 600 nm and is fastened on the chassis 20 of the cooling device via a holder 202 is adjusted in such a way that the light beam falls at an acute angle α onto the planar surface of the mounted wafer 8, 8'.

The surface of the wafer 8 has already been coated in a preceding step with a photosensitive resist. The resist is sensitive to light with a wavelength of 193 nm, 248 nm or 365 nm, and is therefore not impaired by the laser beam.

Because of the acute angle α of less than 10 degrees, the light beam 80 is reflected and falls onto a detector 100 that is likewise fastened on the chassis 20 via a holder 102. The detector 100 preferably has a quad cell with 4 photodiode elements 110–140 (see FIG. 2) that respectively occupy a quadrant of the sensor surface. The quadrants are arranged such that they meet in the middle of the sensor surface and occupy an identical angle on the sensor surface with reference to the midpoint. Via the holder 102, the detector is aligned precisely with reference to the laser 200 such that the light beam 80 reflected by a wafer resting ideally on the cooling plate (CHP) 10 impinges exactly on the middle of the sensor surface as defined by the quadrants.

Because of the light cone distributed uniformly over the four photodiode elements 110–140 of the quad cell, the four elements therefore record the same incidence of light as illustrated in FIG. 2a when the wafer 8 makes contact with the plate over its entire area.

Figure 3:
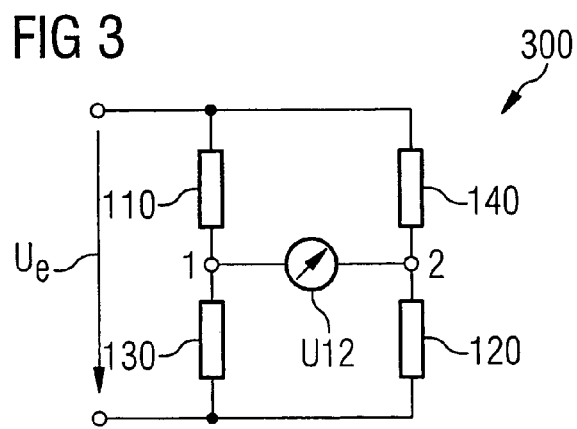
FIG. 3 shows a bridge circuit for producing a balance condition of the four photodiode elements of the quad cell from FIG. 2.

A control and evaluation unit of the arrangement according to the invention also comprises the bridge rectifier circuit 300 illustrated in FIG. 3. The diagonally opposite photodiode elements 110 and 130 as well as 120 and 140 are respectively connected in this case in series in a way similar to the resistors of the bridge circuit, and respectively generate a voltage because of the incidence of light. The potential resulting between the elements connected in series is tapped there and compared with that of the respective other series. Only when the same incidence of light is present overall does the voltmeter U12 arranged between the series indicate a vanishing potential difference.

Figure 2B:
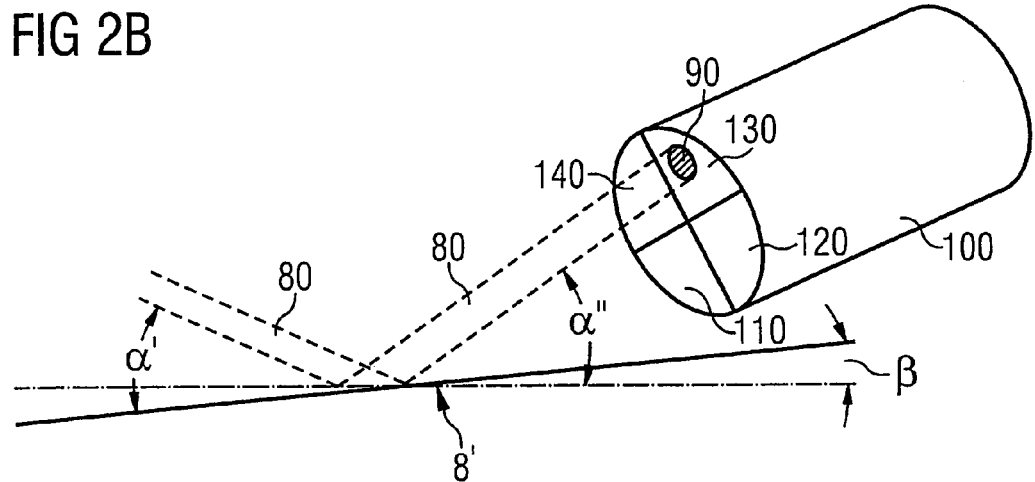

FIG. 2b shows the case in which the wafer 8 is mounted in a tilted fashion. It assumes an angle β with reference to the ideal plane. Since the angle of incidence α' is equal to the angle of emergence, the angle of deflection α" with respect to the ideal plane is composed of α+2β. The point of infringement 90 on the sensor surface is therefore displaced and migrates in the exemplary embodiment with its light component chiefly into the quadrant of the photodiode 130 with small contributions to the photodiode 140.

The respectively generated voltages lead to an imbalance in the bridge circuit, and the voltmeter U12 detects an increasing voltage. The voltage value is transmitted to the control unit of the cool plate or of the entire track. The control unit is also connected to the device for lifting or depositing the substrate on the plate. The voltage value is firstly compared with a limiting value that permits a tolerance of voltage fluctuations in the case of ideally deposited wafers 8. However, if the limiting value is overshot, a warning signal is generated and the device for lifting/depositing the wafer 8 is set in motion in order to bring the wafer 8 into the ideal position by lifting and renewed deposition.

In the example, special cases can occur in which the wafer lies tilted and yet the voltmeter U12 reads a vanishing voltage. This occurs when, for example, owing to the tilted position of the wafer 8 the deflection is so large that no light at all falls onto the detector. This can also be obtained when the light beam is displaced along a boundary line exactly between the photodiode elements 10 and 140 or 120 and 130. Both cases are protected while further determining the overall voltage $U_{ie}$ generated and comparing it with the ideal case.

The invention is not, of course, limited to this specific embodiment. It is equally possible to determine all the generated voltages of a multiplicity of photoelements placed on the sensor surface, and to analyze them using data technology. Other embodiments can also be implemented. However, the above-described embodiment constitutes a particularly simple and therefore cost-effective and quick arrangement for detecting tilted positions of wafers that is scarcely prone to error.

Although the present invention and its advantages have been described in detail, it should be understood that various changes, substitutions and alterations can be made herein without departing from the spirit and scope of the invention as defined by the appended claims.

What is claimed is:

1. An arrangement for feeding or dissipating heat to/from a semiconductor substrate for the purpose of preparing or post-processing a lithographic process, comprising:
    at least one plate that has a substantially planar surface for accommodating the semiconductor substrate and for transmitting heat between the plate and the semiconductor substrate;

a source of heat or cold that is coupled to the plate for the purpose of heating or cooling the plate;

a light source for generating a focused light beam and directing the light beam toward an upper surface of the semiconductor substrate, wherein the upper surface of the substrate is coated with photosensitive resist and wherein the light source for generating the focused light beam is a laser diode that emits a light beam with a wavelength of more than 600 nanometers;

a detector with at least one sensor for detecting the light beam generated by the light source and reflected by the semiconductor substrate; and a control unit coupled to the detector for the purpose of evaluating a position of the reflected light beam.

2. The arrangement as claimed in claim 1, wherein the detector comprises a four-fold photodiode with four photodiodes arranged around a midpoint.

3. The arrangement as claimed in claim 2, wherein each of the four photodiodes is connected as a resistor in a bridge circuit.

4. The arrangement as claimed in claim 1, wherein the detector comprises a CCD chip.

5. The arrangement as claimed in claim 1 and further comprising a device for moving the semiconductor substrate relative to the surface of the plate.

6. The arrangement as claimed in claim 5 wherein the control unit is coupled to the device for moving the semiconductor substrate.

7. The arrangement as claimed in claim 1 wherein the plate comprises a hot plate.

8. The arrangement as claimed in claim 1 wherein the plate comprises a cool plate.

9. The arrangement as claimed in claim 1 wherein the light source comprises a laser light source.

10. A method of processing a semiconductor wafer, the method comprising:

placing a semiconductor wafer on a thermal plate;

irradiating a focused light beam onto an upper surface of the semiconductor wafer, wherein the upper surface of the wafer is coated with photosensitive resist and wherein the focused light beam has a wavelength of more than 600 nanometers;

reflecting the light beam from the upper surface of the semiconductor wafer in the direction of a detector;

detecting the light beam in order to establish an oblique position of the semiconductor wafer on the thermal plate;

raising and once again placing the semiconductor wafer on the thermal plate as a function of a result of detection; and comprising heating or cooling the thermal plate in order to feed or dissipate heat to/from the semiconductor substrate.

11. The method of claim 10 wherein placing a semiconductor wafer on a plate comprises placing a semiconductor wafer on a hot plate.

12. The method of claim 10 wherein placing a semiconductor wafer on a plate comprises placing a semiconductor wafer on a cool plate.

13. The method of claim 10 and further comprising, after raising and once again placing, repeating the steps of irradiating, reflecting and detecting.

14. The method of claim 10 wherein the detecting step comprises detecting a semiconductor wafer deposited at least partially on a projecting position mark of the plate.

* * * * *